(12) United States Patent
Moschiano et al.

(10) Patent No.: US 9,940,193 B2
(45) Date of Patent: Apr. 10, 2018

(54) CHUNK DEFINITION FOR PARTIAL-PAGE READ

(71) Applicant: Micron Technology, Inc., Boise, ID (US)

(72) Inventors: Violante Moschiano, Avezzano (IT); Luigi Pilolli, L'Aquila (IT)

(73) Assignee: Micron Technology, Inc., Boise, ID (US)

( * ) Notice: Subject to any disclaimer, the term of this patent is extended or adjusted under 35 U.S.C. 154(b) by 392 days.

(21) Appl. No.: 14/298,614

(22) Filed: Jun. 6, 2014

(65) Prior Publication Data

US 2015/0357045 A1    Dec. 10, 2015

(51) Int. Cl.
*G11C 29/10*   (2006.01)
*G06F 11/10*   (2006.01)
*G11C 16/26*   (2006.01)
*G11C 29/04*   (2006.01)

(52) U.S. Cl.
CPC .......... *G06F 11/1048* (2013.01); *G11C 16/26* (2013.01); *G11C 2029/0411* (2013.01)

(58) Field of Classification Search
CPC . G11C 29/10; G11C 16/26; G11C 2029/0411; G06F 11/1048
See application file for complete search history.

(56) References Cited

U.S. PATENT DOCUMENTS

| | | |
|---|---|---|
| 2010/0177568 A1 | 7/2010 | Chen et al. |
| 2010/0287329 A1* | 11/2010 | Toelkes ............... G06F 12/0246 711/103 |
| 2012/0198128 A1* | 8/2012 | Van Aken ........... G06F 12/0246 711/103 |
| 2012/0311388 A1 | 12/2012 | Cronin et al. |
| 2012/0331210 A1* | 12/2012 | Jeong .................. G11C 11/5642 711/103 |
| 2013/0103889 A1* | 4/2013 | Jeong .................. G06F 12/0246 711/103 |
| 2013/0194872 A1 | 8/2013 | Sim et al. |

* cited by examiner

*Primary Examiner* — David X Yi
*Assistant Examiner* — Zubair Ahmed
(74) *Attorney, Agent, or Firm* — Brooks, Cameron & Huebsch, PLLC

(57) ABSTRACT

The present disclosure is related to chunk definition for partial-page read. A number of methods can include setting a chunk size for a partial-page read of a page of memory cells. A start address of the partial-page read and chunk size can define a chunk of the page of memory cells. Some method can include enabling only those of a plurality of sense amplifiers associated with the page of memory cells that correspond to the chunk to perform the partial-page read.

22 Claims, 6 Drawing Sheets

CHUNK DEFINITION FOR PARTIAL-PAGE READ

TECHNICAL FIELD

The present disclosure relates generally to semiconductor memory and methods, and more particularly, to chunk definition for partial-page read.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error data, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

A physical page refers to a unit of programming (e.g., a number of memory cells that are programmed together as a functional group). A page of data can refer to an amount of data (e.g., a logical page) stored in a physical page of memory cells. As an example, a logical page size can be 4 kilobytes (kB), 8 kB, 16 kB, 32 kB, etc. In general, page sizes can increase over memory generations to improve program throughput. However, some read operations may desire less than a full page of data, for example 520 byes (B) or 4 kB, among others.

DETAILED DESCRIPTION

Figure 1:
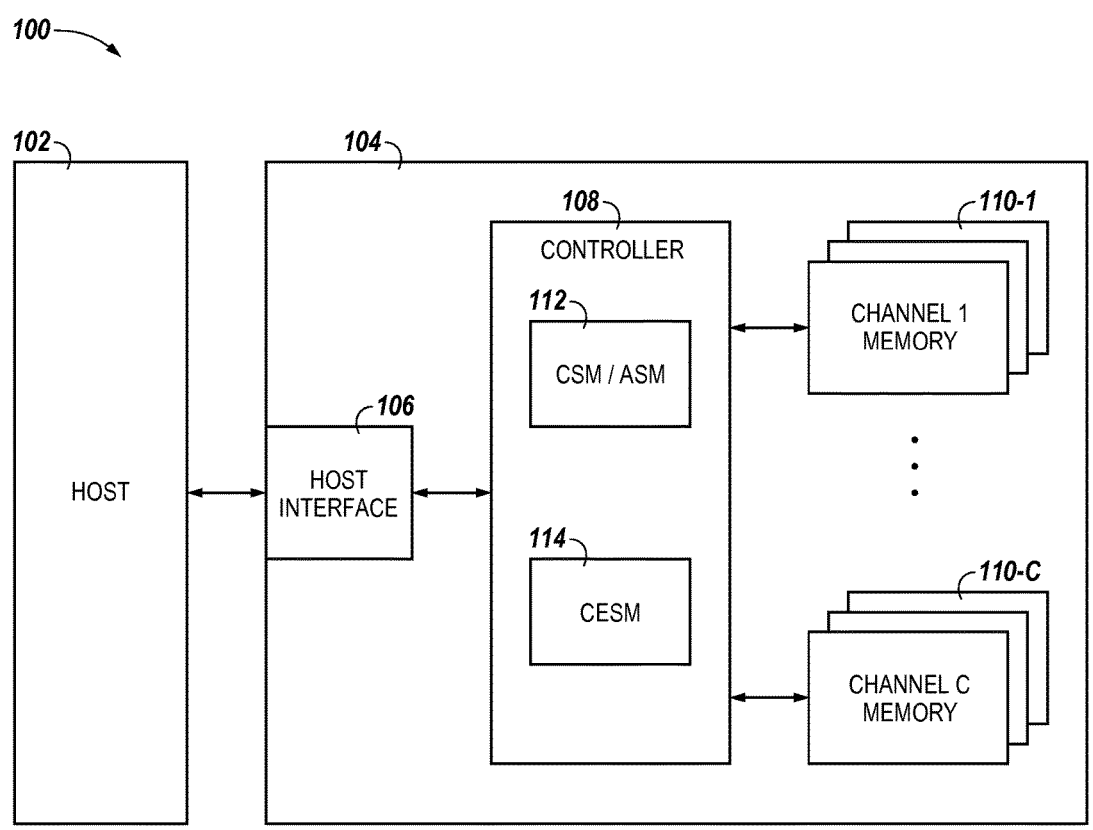
FIG. 1 is a block diagram of an apparatus in the form of a computing system including at least one memory system in accordance with a number of embodiments of the present disclosure.

The present disclosure is related to chunk definition for partial-page read. A number of methods can include setting a chunk size for a partial-page read of a page of memory cells. A start address of the partial-page read and chunk size can define a chunk of the page of memory cells. Some method can include enabling only those of a plurality of sense amplifiers associated with the page of memory cells that correspond to the chunk to perform the partial-page read.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "B", "C", "M", "N", "P", "Q", and "R", particularly with respect to reference numerals in the drawings, indicates that a number of the particular feature so designated can be included. As used herein, "a number of" a particular thing can refer to one or more of such things (e.g., a number of memory devices can refer to one or more memory devices). As used herein, the terms "first" and "second" are used to differentiate between one feature from another and do not necessarily imply an order between the features so designated. For example, "a first data pattern" does not necessarily imply that that the first data pattern came before "a second data pattern."

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, ..., 110-C (e.g., solid state memory devices such as NAND flash devices), which provide a storage volume for the memory system 104. The memory system 104 can be a single memory device.

As illustrated in FIG. 1, the controller 108 can be coupled to the host interface 106 and to the memory devices 110-1, ..., 110-C via a plurality of channels and can be used to send data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., having an on-die controller).

The controller 108 can communicate with the memory devices 110-1, ..., 110-C to control data read, write, and erase operations, among other operations. The memory devices 110-1, ..., 110-C can be a plurality of memory arrays on a single die, a plurality of memory arrays on multiple dies, or a single memory array on a single die. The controller 108 can be on the same die or a different die than any or all of the memory devices 110-1, ..., 110-C.

The arrays can be flash arrays with a NAND architecture or a NOR architecture, for example. However, embodiments are not limited to a particular type of memory array or array architecture. Although floating-gate type flash memory cells in a NAND architecture are generally referred to herein, embodiments are not so limited. Other examples include electrically erasable programmable ROM (EEPROM), erasable programmable ROM (EPROM), ferroelectric RAM (FRAM), and resistance variable memory such as phase change random access memory (PCRAM), resistive random access memory (RRAM), and magnetoresistive random access memory (MRAM), among others.

Although not specifically illustrated, in some embodiments, the controller 108 can include a discrete memory channel controller for each channel coupling the controller 108 to the memory devices 110-1, ..., 110-C. The controller 108 can include, for example, a number of components in the form of hardware and/or firmware (e.g., a number of integrated circuits) and/or software for controlling access to the memory devices 110-1, ..., 110-C and/or for facilitating data transfer between the host 102 and memory devices 110-1, ..., 110-C.

The number of memory devices 110-1, ..., 110-C can include a number of arrays of memory cells (e.g., non-volatile memory cells). The memory cells can be grouped, for instance, into a number of blocks including a plurality of physical pages. A number of blocks can be included in a plane of memory cells and an array can include a number of planes.

In operation, data can be written to and/or read from memory (e.g., memory devices 110-1, ..., 110-C of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host. A sector size can be defined by a file system formatted to the memory devices 110-1, ..., 110-C.

Although not specifically illustrated, the memory system 104 can include an error correction code (ECC) component that can be configured to error code data as codewords. A codeword can have a total size that includes a wrapper and a payload. The codeword payload can refer to the data (e.g., user data) that is encoded within the codeword. The codeword wrapper can refer to the error data that is encoded in the codeword along with the payload to protect the payload. In some embodiments, the ECC component can be configured to error code data with a fixed codeword size.

As illustrated in FIG. 1, the controller 108 can include a command state machine (CSM)/address state machine (ASM) 112 and a chunk enable state machine (CESM) 114. Each of the CSM/ASM 112 and CESM 114 can be discrete components such as an application specific integrated circuit (ASIC) or the components may reflect functionally provided by circuitry and/or executable instructions within the controller 108 that does not necessarily have a discrete physical form separate from other portions of the controller 108. Although illustrated as components within the controller 108 in FIG. 1, each of the CSM/ASM 112 and CESM 114 can be external to the controller 108 or have a number of components located within the controller 108 and a number of components located external to the controller 108. The functionality described herein as being implemented by the controller 108 (e.g., by the CSM/ASM 112 and/or the CESM 114) can be provided as a non-transitory electronic device readable medium storing instructions executable by the electronic device (e.g., firmware in the controller 108) to provide the functionality.

The controller 108 (e.g., the CSM/ASM 112) can be configured to set a chunk size for a partial-page read. A chunk size can be an amount of data less than a logical page of data such that an entire physical page of memory cells does not have to be read to obtain the chunk. A chunk of data can be any size less than the size of a logical page of data. An example of a chunk size is a sector, as described herein, however embodiments are not limited to a chunk size being equal to a sector size. The chunk size can be set based at least in part on a sector size as defined by a file system formatted to the memory apparatus 104. Setting the chunk size as a sector size can improve efficiency for partial-page reads where the data obtained by the partial-page read is to be transferred to the host 102 where the host 102 communicates using sectors because no other operation (e.g., a data segmentation operation, data concatenation operation, etc.) would need to occur before the host 102 can receive the data. In some embodiments, a chunk size can be set based at least in part on a size of an ECC codeword. Setting the chunk size as a codeword size can improve efficiency for partial-page reads where the data obtained by the partial-page read is to be operated on by ECC because no other operation (e.g., a data shift operation, data segmentation operation, etc.) would need to occur before the ECC can operate on the data. In some embodiments, a chunk size can be set based at least in part on an amount of metadata stored per page. Metadata can include integrity data such as error data (e.g., error detecting and/or correcting code data) and/or address data (e.g., logical address data), among other metadata corresponding to the user data.

The chunk size can be set during operation of the memory apparatus 104 (e.g., dynamically). The chunk size can be set for a plurality of partial-page reads or for a particular partial-page read. The chunk size can be set without regard to alignment with a boundary of the page of memory cells, as described in more detail with respect to FIG. 2. Together with a start address, the chunk size can define a chunk of the page of memory cells. The controller 108 (e.g., the CESM 114) can be configured to enable only those of a plurality of sense amplifiers associated with the page of memory cells that correspond to the chunk to perform that partial-page read. A remainder of the sense amplifiers can be disabled and/or remain not enabled in order to reduce power consumption and/or to reduce an amount of time consumed during a partial-page read.

Read requests can originate from the host 102 and/or from the memory system 104, among other originations (e.g., from a direct memory access (DMA) device). For example, a read request can originate from the memory system 104 as part of a wear leveling operation. The memory system 104 can implement wear leveling (e.g., garbage collection and/or reclamation) to control the wear rate on the memory devices 110-1, . . . , 110-C. A memory array can experience errors (e.g., failures) after a number of program and/or erase cycles. Wear leveling can reduce the number of program and/or erase cycles performed on a particular group by spreading the cycles more evenly over the entire array. Wear leveling can include dynamic wear leveling to minimize the amount of valid blocks moved to reclaim a block. Dynamic wear leveling can include a technique called garbage collection. Garbage collection can include reclaiming (e.g., erasing and making available for writing) blocks that have the most invalid pages (e.g., according to a "greedy algorithm"). Alternatively, garbage collection can include reclaiming blocks with more than a threshold amount of invalid pages. If sufficient free blocks exist for a writing operation, then a garbage collection operation may not occur. An invalid page, for example, can be a page of information that has been updated to a different page. Static wear leveling can include writing static information to blocks that have high erase counts to prolong the life of the block.

Figure 2:
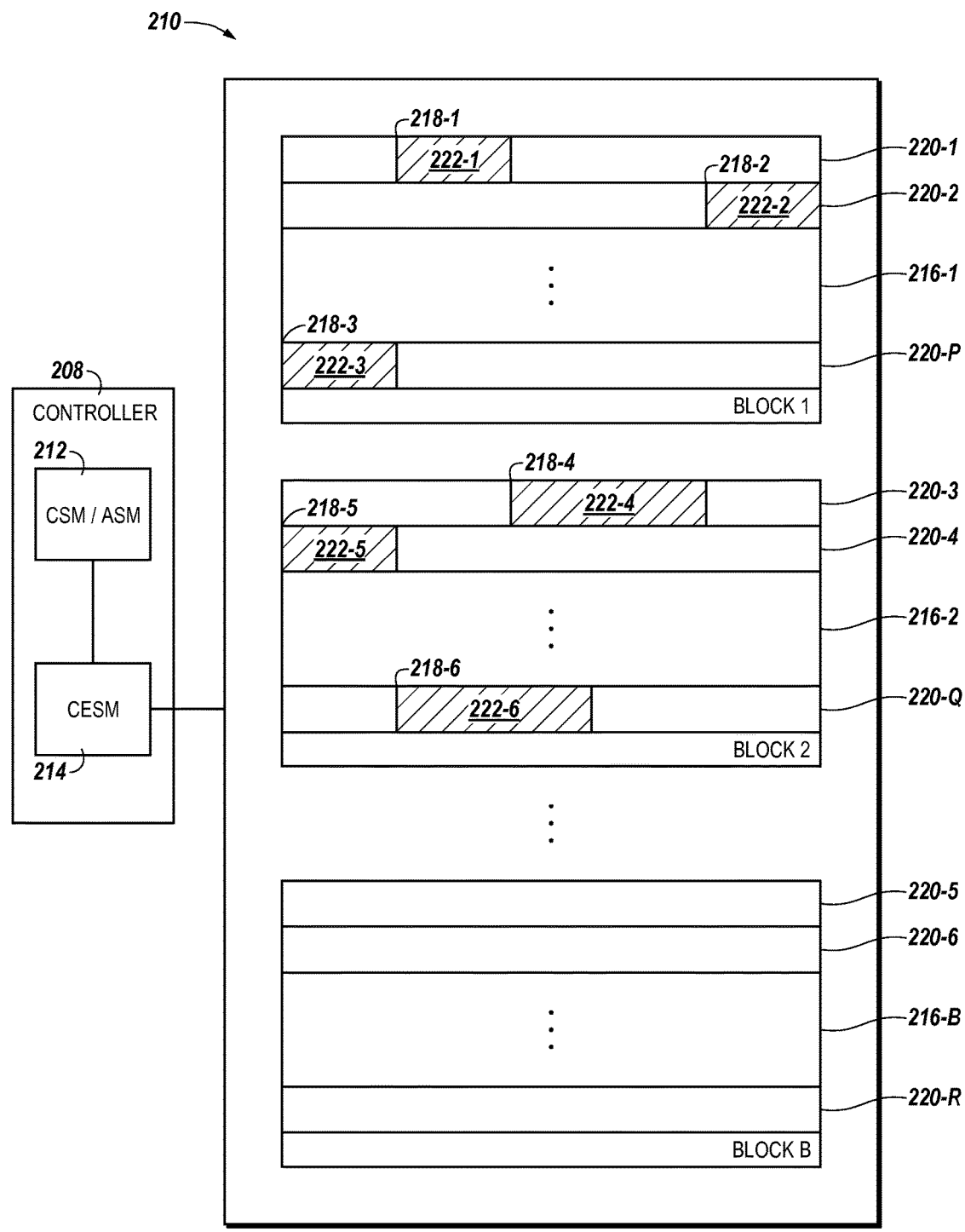
FIG. 2 illustrates a diagram of a portion of a memory array having a number of physical blocks in accordance with a number of embodiments of the present disclosure.

FIG. 2 illustrates a diagram of a portion of a memory device 210 having a number of physical blocks in accordance with a number of embodiments of the present disclosure. Memory device 210 can be analogous to, for example, the memory devices 110-1, . . . , 110-C previously described in connection with FIG. 1.

As shown in FIG. 2, memory device 210 has a number of physical blocks 216-1 (BLOCK 1), 216-2 (BLOCK 2), . . . , 216-B (BLOCK B) of memory cells. The memory cells can be single level cells and/or multilevel cells. As an example, the number of physical blocks in memory device 210 may be 128 blocks, 512 blocks, or 1,024 blocks, but embodiments are not limited to a particular multiple of 128 or to any particular number of physical blocks in memory device 210. Each physical block 216-1, 216-2, . . . , 216-B includes memory cells which can be erased together as a unit (e.g., the cells in each physical block can be erased in a substantially simultaneous manner). For instance, the memory cells in each physical block can be erased together in a single erase operation.

As shown in FIG. 2, each physical block 216-1, 216-2, . . . , 216-B contains a plurality of physical pages of memory cells (e.g., physical pages 220-1, 220-2, . . . , 220-P in block 216-1; physical pages 220-3, 220-4, . . . , 220-Q in block 216-2; and physical pages 220-5, 220-6, . . . , 220-R in block 216-B) coupled to access lines (e.g., word lines). The number of word lines in each physical block can be 32, but embodiments are not limited to a particular number of physical pages per physical block.

A physical page refers to a unit of programming (e.g., a number of memory cells that are programmed together as a functional group). In some embodiments, a row of memory cells can include multiple physical pages of memory cells (e.g., an even page of memory cells coupled to even-numbered bit lines, and an odd page of memory cells coupled to odd numbered bit lines). Additionally, for embodiments including multilevel cells, a physical page of memory cells can store multiple pages (e.g., logical pages) of data (e.g., an upper page of data and a lower page of data, with each cell in a physical page storing one or more bits towards an upper page of data and one or more bits towards a lower page of data). A page of data can refer to an amount of data (e.g., a logical page) stored in a page of memory cells. As an example, a logical page size can be 4 kB, 8 kB, 16 kB, 32 kB, etc.

A controller 208 can be coupled to the memory device 210 and therefore to the plurality of pages of memory cells. The controller 208 illustrated in FIG. 2 can be analogous to the controller 108 illustrated in FIG. 1. For example, the controller can include a CSM/ASM 212 and a CESM 214 analogous to the CSM/ASM 112 and CESM 114 illustrated in FIG. 1.

In various previous approaches, a page read operation can include sensing a page of memory cells together as a functional group in order to determine a page of data stored therein. However, as the page size increases, sensing an entire page of cells together can take an increased amount of time and/or can increase power consumption associated with sensing a page. An increased amount of time for sensing a page can lead to reduced throughput, and increased power consumption can lead to violations of power constraints of a memory device, for instance.

In contrast, in accordance with a number of embodiments of the present disclosure, the controller 208 can set a chunk size for a partial-page read. The controller 208 can provide a partial-page read command and a start address for the partial-page read. The start address and chunk size can define a chunk for the partial-page read.

In some embodiments, the chunk size can be set and used for multiple partial-page reads. For example, in block 216-1, each chunk 222-1, 222-2, 222-3 is the same size. The controller 208 can set a chunk size and then issue a partial-page read command for page 220-1 with start address 218-1 to read chunk 222-1. Without setting a different chunk size, the controller 208 can issue a partial-page read command for page 220-2 with start address 218-2 to read chunk 222-2. Without setting a different chunk size, the controller 208 can issue a partial-page read command for page 220-P with start address 218-3 to read chunk 222-3. Embodiments are not limited to a particular order of reading pages.

In some embodiments, the controller 208 can set a different chunk size for different individual partial-page reads. For example, in block 216-2, each chunk 222-4, 222-5, 222-6 is a different size. The controller 208 can set a first chunk size and then issue a partial-page read command for page 220-3 with start address 218-4 to read chunk 222-4. The controller 208 can set a second chunk size and issue a partial-page read command for page 220-4 with start address 218-5 to read chunk 222-5. The controller 208 can set a third chunk size and issue a partial-page read command for page 220-Q with start address 218-6 to read chunk 222-6.

The chunk size can be set without regard to alignment with a boundary of the page of memory cells. For example, an integer number of chunks do not have to fit within a page (see, for example, chunk 222-6 in page 220-Q, where based on the size of chunk 222-6, an integer number of chunks would not fit in page 220-Q and chunk 222-6 does not align with a boundary (e.g., a beginning or end) of page 220-Q). As another example, a chunk from one page can overlap with a chunk from a second page (see, for example, chunk 222-6 in page 220-Q, which overlaps with chunk 222-5 in page 220-4 as well as chunk 222-4 in page 220-3). As described in more detail with respect to FIG. 4, two chunks "overlap" when at least one memory cell from the first chunk is coupled to a common bit line as at least one memory cell from the second chunk.

In some embodiments, the controller 208 can issue a page read command after having previously set a chunk size and previously issued a partial-page read command. For example, in block 216-B the controller 208 can issue page read commands to read all of pages 220-5, 220-6, 220-R.

Figure 3:
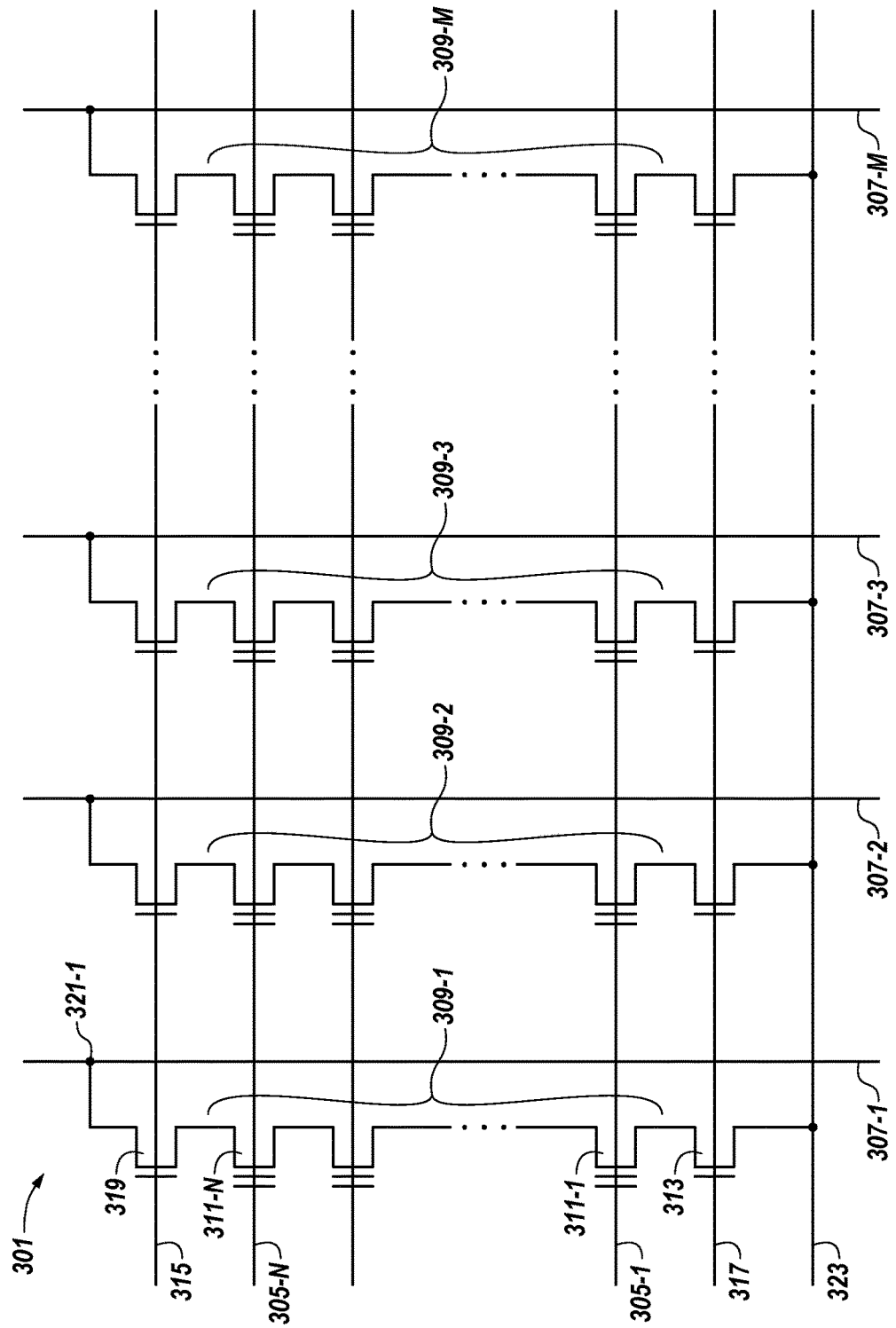
FIG. 3 illustrates a schematic diagram of a portion of a non-volatile memory array in accordance with a number of embodiments of the present disclosure.

FIG. 3 illustrates a schematic diagram of a portion of a non-volatile memory array in accordance with a number of embodiments of the present disclosure. The memory array can be can be contained within the memory devices 110-1, . . . , 110-C illustrated in FIG. 1. The embodiment of FIG. 3 illustrates a NAND architecture non-volatile memory array. However, embodiments described herein are not limited to this example. As shown in FIG. 3, the memory array 301 includes access lines (e.g., word lines 305-1, . . . , 305-N) and intersecting data lines (e.g., local bit lines 307-1, 307-2, 307-3, . . . , 307-M). For ease of addressing in the digital environment, the number of word lines 305-1, . . . , 305-N and the number of local bit lines 307-1, 307-2, 307-3, . . . , 307-M can be some power of two (e.g., 356 word lines by 4,096 bit lines).

Memory array 301 includes NAND strings 309-1, 309-2, 309-3, . . . , 309-M. Each NAND string includes non-volatile memory cells 311-1, . . . , 311-N, each communicatively coupled to a respective word line 305-1, . . . , 305-N. Each NAND string (and its constituent memory cells) is also associated with a local bit line 307-1, 307-2, 307-3, . . . , 307-M. The memory cells 311-1, . . . , 311-N of each NAND string 309-1, 309-2, 309-3, . . . , 309-M are coupled in series source to drain between a source select gate (SGS) (e.g., a field-effect transistor (FET) 313) and a drain select gate (SGD) (e.g., FET 319). Each source select gate 313 is configured to selectively couple a respective NAND string to a common source 323 responsive to a signal on source select line 317, while each drain select gate 319 is configured to selectively couple a respective NAND string to a respective bit line responsive to a signal on drain select line 315.

As shown in the embodiment illustrated in FIG. 3, a source of source select gate 313 is coupled to a common source line 323. The drain of source select gate 313 is coupled to the source of the memory cell 311-1 of the corresponding NAND string 309-1. The drain of drain select gate 319 is coupled to bit line 307-1 of the corresponding NAND string 309-1 at drain contact 321-1. The source of drain select gate 319 is coupled to the drain of the last memory cell 311-N (e.g., a floating-gate transistor) of the corresponding NAND string 309-1.

In a number of embodiments, construction of the non-volatile memory cells 311-1, . . . , 311-N includes a source, a drain, a floating gate or other charge storage structure, and a control gate. The memory cells 311-1, . . . , 311-N have their control gates coupled to a word line, 305-1, . . . , 305-N, respectively. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

A number (e.g., a subset or all) of cells coupled to a selected word line (e.g., 305-1, . . . , 305-N) can be written and/or read together as a group. A number of cells written and/or read together can correspond to a page of data. As used herein, examples of high-level operations are referred to as writing or reading operations (e.g., from the perspective of a controller), whereas, with respect to the memory cells, such operations are referred to as programming or sensing. A group of cells coupled to a particular word line and programmed together to respective states can be referred to as a target page. A programming operation can include applying a number of program pulses (e.g., 16V-20V) to a selected word line in order to increase the threshold voltage (Vt) of selected cells coupled to that selected word line to a desired program voltage level corresponding to a targeted state.

Read operations can include sensing a voltage and/or current change of a bit line coupled to a selected cell in order to determine the state of the selected cell. The read operation can include precharging a bit line and sensing the discharge when a selected cell begins to conduct. Two different types of read operations are described herein (e.g., those using a ramping read signal versus using a plurality of discrete read signals).

Sensing the state of a selected cell can include providing a ramping read signal (e.g., −2V to +3V) to a selected word line, while providing a signal (e.g., a pass voltage such as 4.5V) to word lines coupled to the unselected cells of the string sufficient to place the unselected cells in a conducting state independent of the charge stored on the unselected cells. Alternatively, sensing the state of a selected cell could include applying discrete read signal levels (e.g., −0.05V, 0.5V, and 2V) to a selected word line, and thus to the control gate of a selected cell. The bit line corresponding to the selected cell being read and/or verified can be sensed to determine whether or not the selected cell conducts in response to the particular read signal applied to the selected word line. For example, the state of a selected cell can be determined by the word line voltage at which the bit line current reaches a particular reference current associated with a particular state.

Although not specifically illustrated in FIG. 3, each bit line 307-1, 307-2, 307-3, . . . , 307-M can be coupled to a sense amplifier (or a number of the bit lines can be coupled to a sense amplifier). The sense amplifier can be included in a page buffer (e.g., as illustrated in more detail in FIG. 4). According to a number of embodiments of the present disclosure, a partial-page read can include enabling only a subset of the plurality of sense amplifiers. For example, a partial page read of a page of memory cells associated with word line 305-1 can include enabling sense amplifiers associated with bit line 309-1 and 309-2, but not enabling sense amplifiers associated with bit lines 309-3, . . . , 309-M. Additional aspects are illustrated and described in more detail with respect to FIG. 4.

Figure 4:
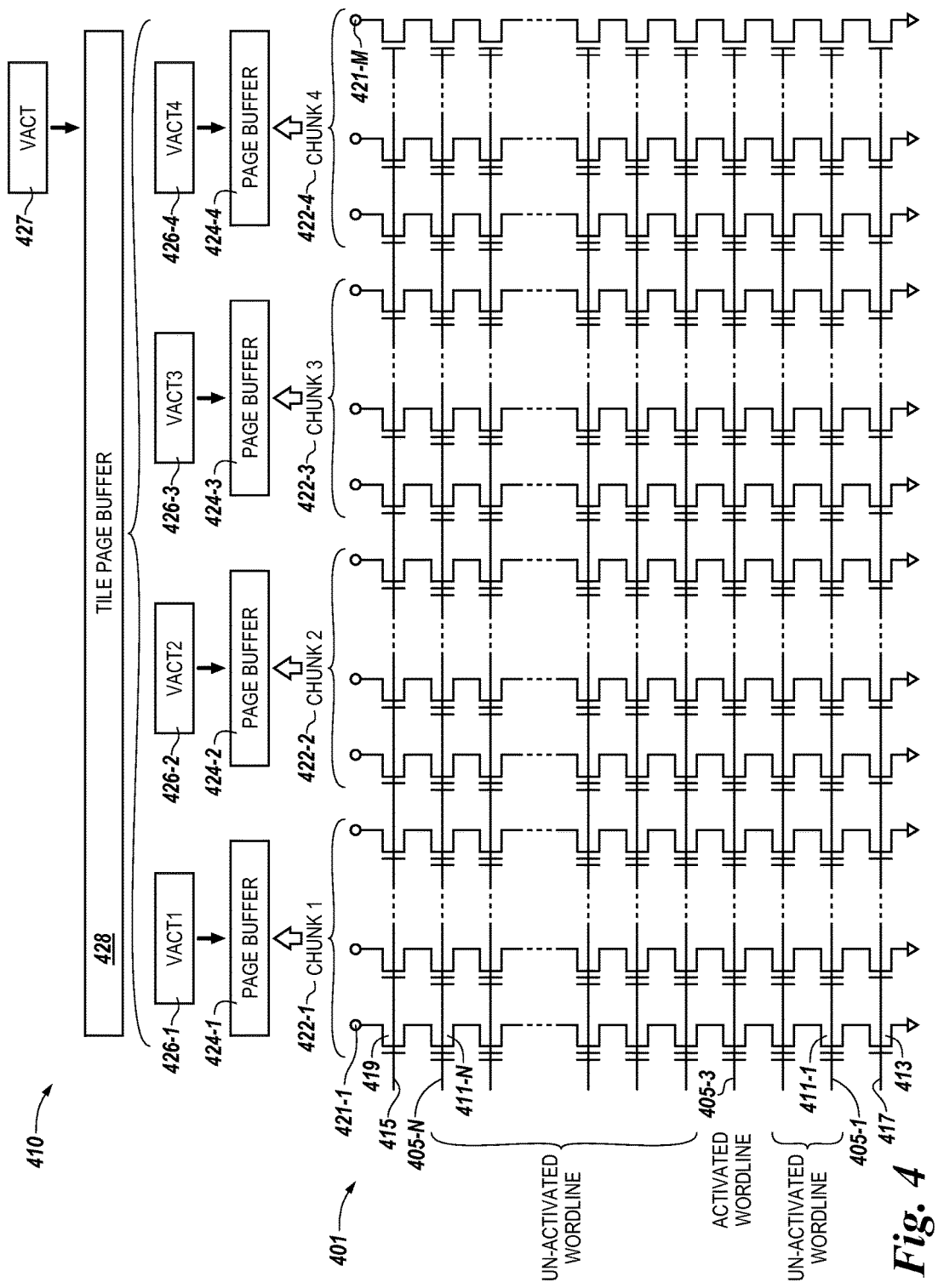
FIG. 4 illustrates a diagram of a portion of a memory device in accordance with a number of embodiments of the present disclosure.

FIG. 4 illustrates a diagram of a portion of a memory device in accordance with a number of embodiments of the present disclosure. As shown in FIG. 4, memory device 410 includes a memory array 401. The memory array 401 can be analogous to the memory array 301 illustrated in FIG. 3. For example, as illustrated in FIG. 4, and in a manner analogous to that previously described in connection with FIG. 3, memory array 401 can include non-volatile memory cells 411-1, . . . , 411-N coupled to a respective word line 405-1, ..., 405-N and connected in series between an SGS 413 and an SGD 419. Each SGD 419 is configured to selectively couple a respective string of cells 411-1, ..., 411-N to a respective bit line (not shown) responsive to a signal on drain select line 415. As such, the voltages and/or currents at the drain contacts 421-1, ..., 421-M correspond to the voltages and/or currents on the respective bit lines. Therefore, sensing a respective bit line can include determining a voltage and/or current at a respective drain contact 421-1, ..., 421-M. Each word line 405-1 to 405-N of array 401 can comprise a physical page of memory cells. The memory cells of the page are coupled to a respective number of bit lines (e.g., at drain contacts 421-1 to 421-M).

Each page of the memory device 410 can include a plurality of page buffers associated therewith. Each of the plurality of page buffers can be associated with a different chunk of data. For example, in the embodiment illustrated in FIG. 4, page buffer 424-1 is associated with chunk 422-1, page buffer 424-2 is associated with chunk 422-2, page buffer 424-3 is associated with chunk 422-3, and page buffer 424-4 is associated with chunk 422-4. Each page buffer is coupled to a respective number of bit lines. Each page buffer 424-1, 424-2, 424-3, and 424-4 is coupled to those cells of an activated page (e.g., corresponding to activated word line 405-3) storing a portion of the page of data stored in the page of memory cells. A chunk size may be set at least in part based on an amount of data that can be stored in each page buffer, however embodiments are not limited to such physical constraints.

Although not specifically illustrated in FIG. 4, a chunk size could be set such that a chunk of data is greater than or less than the amount of data storable in one page buffer. In an example where a chunk size is set equal to the size of a page buffer, a number of page buffers equal to the number of chunks to be read in a partial-page read can be enabled for the partial-page read. In an example where the chunk size is set greater than the size of a page buffer, a sufficient number of page buffers can be enabled to handle the amount of data (e.g., number of chunks) to be read in the partial-page read. For example, if a chunk size is such that it can be stored in 1.5 page buffers, then two page buffers can be enabled to read one chunk. In an example where the chunk size is set less than the size of the page buffer, a sufficient number of page buffers can be enabled to handle the amount of data (e.g., number of chunks) to be read in the partial-page read. In general, a subset of the plurality of page buffers of a particular page of memory cells corresponding to the chunk can be enabled for the partial-page read. Furthermore, embodiments of the present disclosure are not limited to a particular number of page buffers or a particular amount of data storable in the page buffers. A controller (not specifically illustrated in FIG. 4) can enable a page buffer 424-1, 424-2, 424-3, 424-4 by writing a particular data pattern to the page buffer 424-1, 424-2, 424-3, 424-4, as described herein (e.g., all ones). By way of example, a page buffer can be enabled with a respective activation signal "VACT" 426-1, 426-2, 426-3, 426-4.

In some embodiments, memory array 401 can be a portion (e.g., a portion of a level) of a three-dimensional array (e.g., a multi-level array) in which other arrays similar to array 401 are at different levels, for example above and/or below array 401. The plurality of page buffers can be associated with each different tile of the page. For example, in the embodiment illustrated in FIG. 4, memory device 410 includes four page buffers 424-1, 424-2, 424-3, and 424-4 associated with the tile shown in FIG. 4, wherein the four page buffers collectively form a tile page buffer 428. That is, tile page buffer 428 includes the four page buffers 424-1, 424-2, 424-3, and 424-4.

As such, the portion of memory array 401 shown in FIG. 4 can be a physical portion (e.g., a tile) of a page (e.g., a physical page) of memory cells. That is, the memory cells illustrated in FIG. 4 can form a tile of a page of memory cells. The page can include a number of additional tiles of memory cells in addition to the tile illustrated in FIG. 4. The additional tiles of the page (not shown in FIG. 4) can be in the same level (e.g., tier and/or control gate plate) of the three-dimensional array. That is, the page can include a plurality of tiles of memory cells in the same level of the three-dimensional array, one tile of which is illustrated in FIG. 4. As an example, the page can include 32 tiles. However, embodiments of the present disclosure are not limited to a particular number of tiles. Each memory cell of a tile (e.g., each cell of the tile illustrated in FIG. 4) can be coupled to a common control gate and the strings which include the cells of a particular tile can be controlled by the same (e.g., a common local) drain select line (e.g., drain select line 415). An example of a level of a three-dimensional array will be further described herein (e.g., in connection with FIG. 6).

The page of memory cells can store a plurality of chunks of data, with each tile of the page storing a different portion of each chunk. That is, different portions of each chunk of data can be stored in different tiles. For example, in the embodiment illustrated in FIG. 4, the page can store four chunks (e.g., chunk 1, chunk 2, chunk 3, and chunk 4) of data, with the tile illustrated in FIG. 4 storing a portion (not all) of chunk 1, a portion of chunk 2, a portion of chunk 3, and a portion of chunk 4. The other (remaining) portions of chunks 1, 2, 3, and 4 can be stored in the other tiles of the page (not shown in FIG. 4). Further, cells storing a particular chunk of data of the page can be included in a plurality of NAND strings, wherein at least some of the NAND strings of the plurality of NAND strings are coupled to respective ones of the bit lines responsive to signals on different drain select lines.

Figure 5:
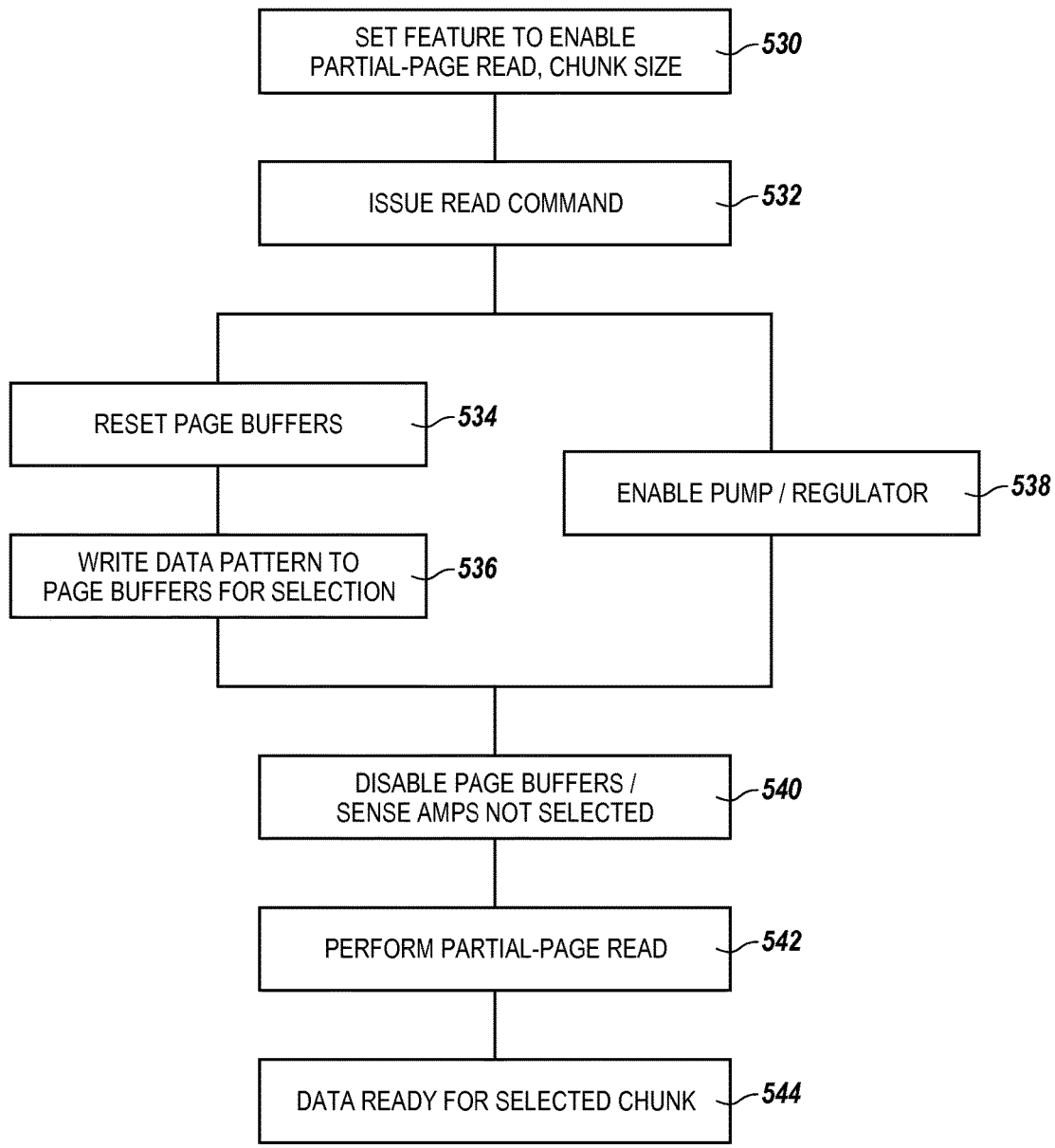
FIG. 5 is a flow chart illustrating a method of operating memory in accordance with a number of embodiments of the present disclosure.

The page buffers corresponding to the chunk to be read can be activated by, for instance, applying an activation signal to those page buffers while the word line coupled to the page is activated (e.g., while the sensing signal is applied to the word line) and after enabling a charge pump, as described in more detail with respect to FIG. 5, (e.g., pre-charging the bit lines associated with the chunk). For example, in the embodiment illustrated in FIG. 4, page buffer 424-1 can be activated by applying activation signal 426-1 (e.g., Vact1) to page buffer 424-1 while word line 405-3 is activated and after pre-charging bit lines associated with chunk 422-1, page buffer 424-2 can be activated by applying activation signal 426-2 (e.g., Vact2) to page buffer 424-2 while word line 405-3 is activated and after pre-charging bit lines associated with chunk 422-2, page buffer 424-3 can be activated by applying activation signal 426-3 (e.g., Vact3) to page buffer 424-3 while word line 405-3 is activated and after pre-charging bit lines associated with chunk 422-3, page buffer 424-4 can be activated by applying activation signal 426-4 (e.g., Vact4) to page buffer 424-4 while word line 405-3 is activated and after pre-charging bit lines associated with chunk 422-4. Likewise, tile page buffer 428 can be activated by applying tile page buffer activation signal 427. Each respective activated page buffer associated with a particular tile can then store the data (e.g., the data of the chunk corresponding to that page buffer) and/or output (e.g., send) the data to the controller.

FIG. 5 is a flow chart illustrating a method of operating memory in accordance with a number of embodiments of the present disclosure. At 530 a set feature command can enable a partial-page read and include an indication of a chunk size so that the memory apparatus can set the chunk size. In some embodiments, the set feature command can generally command partial-page reads (e.g., such that all future reads will be partial-page reads until a different set feature command changes the mode of operation). In some embodiments, the seat feature command can command the partial-page read for a subsequent read only. A memory controller, such as memory controller 102 illustrated in FIG. 1, can be configured to write data to a memory array on a page basis, read data from the memory array on a page basis in response to a first set feature command (e.g., a set feature command that commands reading on a page basis), and read data from the array on a partial-page basis in response to a second set feature command (e.g., a set feature command that commands reading on a partial-page basis). The indication of the chunk size can be one of a plurality of different chunk sizes. The memory apparatus can operate with any chunk size for a particular read and/or different chunk sizes for different reads.

At 532 a read command can be issued. The command can be for a partial-page read and can include a start address. The start address and chunk size together can define a chunk of a page of memory cells.

At 534 the page buffers associated with the page to be partially read can be reset (e.g., in response to the read command being issued). In some embodiments, all of the page buffers for the page to be read can be reset. At 536 a data pattern can be written to a subset of the page buffers for the page to be partially read (e.g., after the page buffers have been reset). In some embodiments, a first data pattern (e.g., all ones (1s)) can be written to the subset of the page buffers to select the subset of the page buffers and a second data pattern (e.g., all zeroes (0s)) can be written to a remainder of the page buffers for the page to be partially read. Embodiments are not limited to a particular data pattern. The subset of the page buffers correspond to the chunk (e.g., those page buffers associated with the memory cells that are to be sensed during the partial-page read according to the chunk as described in more detail with respect to FIG. 4). Writing the data pattern to the subset of the plurality of page buffers can select the subset of the plurality of page buffers for the partial-page read. Writing the data pattern to the plurality of page buffers can enable sense amplifiers associated with the subset of page buffers in response to the first data pattern being written thereto. In some embodiments, the first data pattern can be written to the plurality of page buffers for the page to select the page for a page read (as opposed to a partial-page read).

At 538 a charge pump and/or a regulator can be enabled in response to the partial-page read command being issued. The charge pump and/or regulator can be enabled while the page buffers are being reset and/or while the data pattern is being written to the subset of page buffers. In some embodiments, the charge pump and/or regulator can be enabled before the subset of the page buffers are selected and/or before sense amplifiers associated with the page buffers are enabled. At 540 page buffers and their associated sense amplifiers that are not selected can be disabled and/or remain not enabled. In some embodiments, the remainder of the page buffers can be disabled and/or remain not enabled in response to a second data pattern being written thereto. Disabling and/or not enabling the remainder of page buffers and their associated sense amplifiers can advantageously reduce an amount of energy consumed by the partial-page read and/or reduce an amount of time needed to complete the partial-page read versus enabling all of the page buffers and/or sense amplifiers for the page. At 542 the partial-page read can be performed (e.g., in response to the sense amplifiers associated with the selected page buffers being enabled). At 544 the data can be ready (e.g., ready to output to a host, to ECC circuitry, to a DMA module, to another apparatus, etc.).

Figure 6:
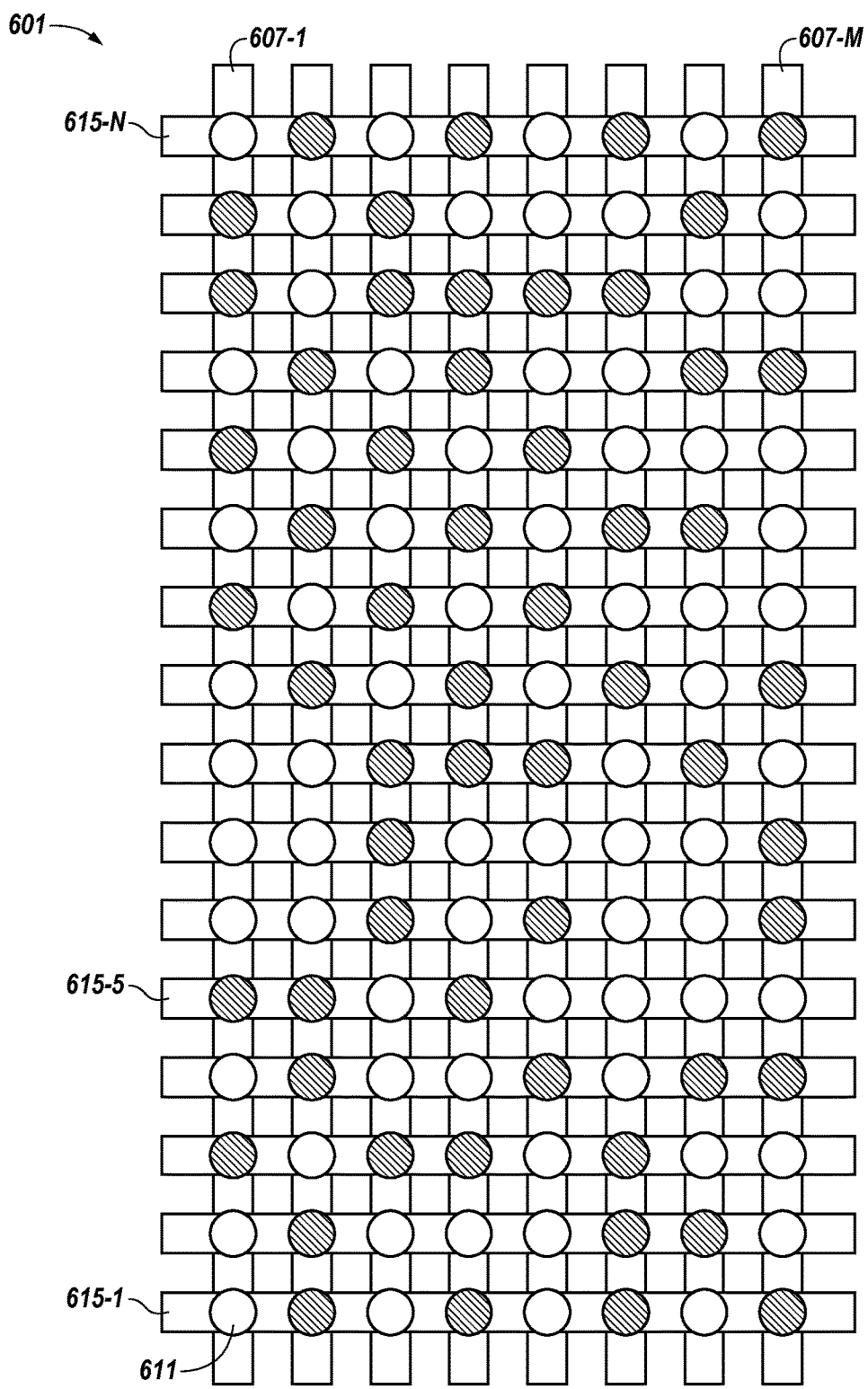
FIG. 6 illustrates a diagram of a portion of a non-volatile memory array 601 in accordance with a number of embodiments of the present disclosure.

FIG. 6 illustrates a diagram of a portion of a non-volatile memory array 601 in accordance with a number of embodiments of the present disclosure. Memory array 601 can be a level (e.g., tier and/or control gate plate) of a three-dimensional array (e.g., a multi-level array) in which other arrays similar to array 601 are at different levels, for example above and/or below array 601. For instance, memory array 601 can be the third level of a 32-level array. However, embodiments of the present disclosure are not limited to a particular number of levels.

As shown in FIG. 6, memory array 601 (e.g., a level of a three-dimensional array in accordance with a number of embodiments of the present disclosure) includes drain select lines (e.g., drain select lines 615-1, . . . , 615-N) and intersecting bit lines (e.g., bit lines 607-1, . . . , 607-M). A non-volatile memory cell can be located at the intersection of each drain select line and bit line, as shown in FIG. 6. For example, in the embodiment illustrated in FIG. 6, memory cell 611 is located at the intersection of drain select line 615-1 and bit line 607-1.

Each memory cell can be a part of a cell pillar (e.g., a vertical cell pillar) of the three-dimensional array. As an example, a physical block of the three-dimensional array may include 16 cell pillars. However, embodiments of the present disclosure are not so limited. Further, each memory cell can be programmed to a targeted one of two different data states, which can be represented by the binary units 1 or 0. For instance, in the embodiment illustrated in FIG. 6, the memory cells programmed to data state 1 are shaded, and the memory cells programmed to data state 0 are not shaded.

In a number of embodiments of the present disclosure, while array 601 is selected, a number of chunks of data can be read with respect to a first drain select line (e.g., drain select line 615-1), and then a number of chunks of data can be read with respect to a second drain select line (e.g., drain select line 615-5). That is, a chunk of data can be read by changing from the first drain select line to the second drain select line while array 601 is selected.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method comprising:
setting a chunk size for a partial-page read of a page of memory cells based at least in part on a size of an error correction code (ECC) codeword or an amount of metadata stored per page,
wherein the chunk size is set via a memory apparatus and during operation of the memory apparatus, and
wherein a start address of the partial-page read and chunk size define a chunk of the page of memory cells; and
enabling, via the memory apparatus, only those of a plurality of sense amplifiers associated with the page of memory cells that correspond to the chunk to perform the partial-page read.

2. The method of claim 1, wherein setting the chunk size during operation of the memory apparatus comprises one of setting the chunk size for a plurality of partial-page reads and setting the chunk size for a particular partial-page read.

3. The method of claim 1, wherein setting the chunk size comprises setting the chunk size based at least in part on a sector size as defined by a file system formatted to the memory apparatus.

4. The method of claim 1, wherein setting the chunk size comprises setting the chunk size without regard to alignment with a boundary of the page of memory cells.

5. A method comprising:
receiving an indication of a chunk size based at least in part on a size of an error correction code (ECC) codeword or an amount of metadata stored per page;
receiving a command to perform a partial-page read of a page of memory cells;
receiving a start address, wherein the start address and chunk size define a chunk of the page of memory cells; and
writing a data pattern to a subset of a plurality of page buffers to select the subset of the plurality of page buffers for the partial-page read;
wherein the subset of the plurality of page buffers correspond to the chunk; and
wherein a page of the memory cells includes a plurality of page buffers.

6. The method of claim 5, wherein the method includes resetting the plurality of page buffers before writing the data pattern to the subset of the plurality of page buffers.

7. The method of claim 5, wherein writing the data pattern to the subset of the plurality of page buffers comprises writing a first data pattern to the subset of the plurality of page buffers; and
wherein the method includes writing a second data pattern to a remainder of the plurality of page buffers.

8. The method of claim 7, wherein the method includes disabling sense amplifiers associated with the remainder of the plurality of page buffers in response to the second data pattern being written thereto.

9. The method of claim 7, wherein the method includes enabling sense amplifiers associated with the subset of the plurality of page buffers in response to the first data pattern being written thereto.

10. The method of claim 9, wherein the method includes enabling a charge pump before enabling the sense amplifiers.

11. The method of claim 10, wherein the method includes performing the partial-page read on the chunk in response to the sense amplifiers being enabled.

12. The method of claim 5, wherein the method is performed by a memory apparatus.

13. An apparatus, comprising:
a plurality of pages of memory cells, wherein each of the plurality of pages of memory cells is associated with a respective plurality of page buffers, wherein one of the respective plurality of page buffers is coupled to a plurality of bit lines;
a controller coupled to plurality of pages of memory cells, wherein the controller is configured to:
set a chunk size for a partial-page read based at least in part on a size of an error correction code (ECC) codeword or an amount of metadata stored per page;
provide a partial-page read command and a start address for the partial-page read, wherein the start address and the chunk size define a chunk for the partial-page read; and
enable a subset of the plurality of page buffers of a particular page of memory cells corresponding to the chunk for the partial-page read.

14. The apparatus of claim 13, wherein the apparatus includes a three-dimensional array of memory cells including a plurality of arrays of memory cells; and
wherein the plurality of pages of memory cells each include a plurality of tiles of memory cells, wherein each of the plurality of tiles is associated with a tile page buffer.

15. The apparatus of claim 14, wherein the particular page of memory cells is included in a particular one of the plurality of tiles; and
wherein the controller is configured to enable the tile page buffer associated with the particular tile for the partial-page read.

16. The apparatus of claim 14, wherein the particular page of memory cells is distributed across more than one of the plurality of tiles; and
wherein the controller is configured to enable the tile page buffers associated with the more than one of the plurality of tiles for the partial-page read.

17. The apparatus of claim 13, wherein the controller includes:
a command/address state machine configured to provide the partial-page read command and a start address; and
a chunk enable state machine coupled to the command/address state machine and to the plurality of pages of memory cells, wherein the chunk enable state machine is configured to enable the subset of the plurality of page buffers.

18. An apparatus, comprising:
a plurality of pages of memory cells, wherein each of the plurality of pages of memory cells includes a plurality of page buffers, wherein one of the plurality of page buffers is coupled to a plurality of bit lines; and
a controller coupled to the plurality of pages of memory cells, wherein the controller is configured to:
write data to the memory array on a page basis;
read data from the memory array on a page basis in response to a first set feature command;
read data from the memory array on a partial-page basis in response to a second set feature command;

wherein the second set feature command includes an indication of a chunk size, based at least in part on a size of an error correction code (ECC) codeword or an amount of metadata stored per page, which together with a start address defines a chunk for a partial-page read of a particular one of the plurality of pages of memory cells; and wherein the controller is configured to write a data pattern to a subset of the plurality of page buffers of a particular page of memory cells corresponding to the chunk to select the chunk for the partial-page read.

19. The apparatus of claim 18, wherein the second command comprises a set feature command that generally commands partial-page reads with the chunk size for future reads.

20. The apparatus of claim 18, wherein the second command comprises a set feature command that commands the partial-page read with the chunk size for a subsequent read.

21. The apparatus of claim 18, wherein the controller is configured to write the data pattern to the plurality of page buffers of the particular page of memory cells to select the particular page of memory cells for a page read.

22. The apparatus of claim 18, wherein the indication of the chunk size included with the second set feature command comprises one of a plurality of different chunk sizes.

* * * * *